United States Patent
Fukami et al.

(10) Patent No.: US 9,799,822 B2
(45) Date of Patent: Oct. 24, 2017

(54) MAGNETIC MEMORY ELEMENT AND MAGNETIC MEMORY

(75) Inventors: Shunsuke Fukami, Tokyo (JP); Nobuyuki Ishiwata, Tokyo (JP); Tadahiko Sugibayashi, Tokyo (JP); Hideo Ohno, Miyagi (JP); Shoji Ikeda, Miyagi (JP); Michihiko Yamanouchi, Miyagi (JP)

(73) Assignees: NEC CORPORATION, Tokyo (JP); TOHOKU UNIVERSITY, Miyagi (JP)

( * ) Notice: Subject to any disclaimer, the term of this patent is extended or adjusted under 35 U.S.C. 154(b) by 0 days.

(21) Appl. No.: 14/118,093

(22) PCT Filed: Apr. 19, 2012

(86) PCT No.: PCT/JP2012/061165
§ 371 (c)(1),
(2), (4) Date: Nov. 15, 2013

(87) PCT Pub. No.: WO2012/160937
PCT Pub. Date: Nov. 29, 2012

(65) Prior Publication Data
US 2014/0097509 A1 Apr. 10, 2014

(30) Foreign Application Priority Data

May 20, 2011 (JP) .................. 2011-113697

(51) Int. Cl.
*H01L 29/82* (2006.01)
*H01L 43/02* (2006.01)
(Continued)

(52) U.S. Cl.
CPC ............ *H01L 43/02* (2013.01); *G11C 11/161* (2013.01); *H01L 27/228* (2013.01); *H01L 43/08* (2013.01)

(58) Field of Classification Search
CPC ....... H01L 27/222; H01L 43/02; H01L 43/12; H01L 27/22–27/2228; H01L 29/82; H01L 43/00; G11C 11/161; G11C 11/16
See application file for complete search history.

(56) References Cited

U.S. PATENT DOCUMENTS 8,174,873 B2  5/2012  Suzuki et al.
2001/0038927 A1* 11/2001 Hasewaga ............ B82Y 10/00
428/811
(Continued)

FOREIGN PATENT DOCUMENTS

JP  2005-191032  7/2005
JP  2009-081315  4/2009
(Continued)

OTHER PUBLICATIONS

International Search Report, PCT/JP2012/061165, Jun. 5, 2012.
(Continued)

*Primary Examiner* — Thao X Le
*Assistant Examiner* — Nduka Ojeh
(74) *Attorney, Agent, or Firm* — Young & Thompson

(57) ABSTRACT

A disclosed magnetic memory element includes: a magnetization free layer formed of a ferromagnetic substance having perpendicular magnetic anisotropy; a response layer provided so as to be opposed to the magnetization free layer and formed of a ferromagnetic substance having perpendicular magnetic anisotropy; a non-magnetic layer provided so as to be opposed to the response layer on a side opposite to the magnetization free layer and formed of a non-magnetic substance; and a reference layer provided so as to be opposed to the non-magnetic layer on a side opposite to the response layer and formed of a ferromagnetic substance having perpendicular magnetic anisotropy. The magnetization free layer includes a first magnetization fixed region and a second magnetization fixed region which have magneti-
(Continued)

zation fixed in directions antiparallel to each other, and a magnetization free region in which a magnetization direction is variable.

21 Claims, 15 Drawing Sheets

(51) Int. Cl.
  *H01L 27/22* (2006.01)
  *G11C 11/16* (2006.01)
  *H01L 43/08* (2006.01)

(56) References Cited

U.S. PATENT DOCUMENTS

| | | | |
|---|---|---|---|
| 2004/0001372 A1* | 1/2004 | Higo | B82Y 25/00 365/200 |
| 2008/0164547 A1* | 7/2008 | Higo | H01L 43/08 257/421 |
| 2009/0080239 A1 | 3/2009 | Nagase et al. | |
| 2009/0290410 A1* | 11/2009 | Wang | H01L 43/08 365/158 |
| 2010/0009467 A1* | 1/2010 | Horng | H01L 43/12 438/3 |
| 2010/0046288 A1 | 2/2010 | Honjou et al. | |
| 2010/0109110 A1* | 5/2010 | Wang | H01L 43/08 257/421 |
| 2010/0188890 A1* | 7/2010 | Fukami | B82Y 10/00 365/158 |
| 2010/0237449 A1* | 9/2010 | Fukami | G11C 11/16 257/421 |
| 2011/0116306 A1* | 5/2011 | Suzuki | G11C 11/15 365/158 |
| 2011/0267879 A1* | 11/2011 | Nagahara | G11C 11/16 365/171 |

FOREIGN PATENT DOCUMENTS

| | | | |
|---|---|---|---|
| JP | 2010-219104 | 9/2010 | |
| WO | WO 2008/068967 | 6/2008 | |
| WO | WO 2009/001706 | 12/2008 | |
| WO | WO 2009001706 A1 * | 12/2008 | B82Y 10/00 |
| WO | WO 2009/060749 | 5/2009 | |
| WO | 2009-093387 | 7/2009 | |
| WO | WO 2010/007893 | 1/2010 | |
| WO | WO 2010007893 A1 * | 1/2010 | G11C 11/15 |
| WO | WO 2010/041719 | 4/2010 | |
| WO | WO 2010/095589 | 8/2010 | |

OTHER PUBLICATIONS

Sakimura et al., "MRAM Cell Technology for Over 500-MHz SoC", IEEE Journal of Solid-State Circuits, 2007, vol. 42, p. 830.
Yamaguchi et al., "Real-Space Observation of Current-Driven Domain Wall Motion in Submicron Magnetic Wires", Physical review Letters, 2004, vol. 92, p. 077205.
Fukami et al., "Micromagnetic analysis of current driven domain wall motion in nanostrips with perpendicular magnetic anisotropy", Journal of Applied Physics, 2008, vol. 103, p. 07E718.
Japanese Office Action dated Jul. 22, 2015 in corresponding Japanese Patent Application No. 2013-516265 with English translation of Japanese Office Action.
JP Office Action, dated Oct. 28, 2015; Application No. 2013-516265, with partial English translation.

* cited by examiner

MAGNETIC MEMORY ELEMENT AND MAGNETIC MEMORY

TECHNICAL FIELD

This invention relates to a magnetic memory element and a magnetic memory. More particularly, this invention relates to a magnetic memory element which uses domain wall motion and is formed of a material having perpendicular magnetic anisotropy, and to a magnetic memory which uses such a magnetic memory element.

BACKGROUND ART

A magnetic memory, or a magnetic random access memory (MRAM) is a nonvolatile memory which can operate at a high speed and is rewritable for infinite times. The magnetic memory partly has gone into commercial use and is under development for the purpose of enhancing the general versatility thereof. In an MRAM, a magnetic substance is used as a storage element, and information is stored in correspondence with the direction of magnetization of the magnetic substance. Several methods have been proposed as methods of switching magnetization of the magnetic substance, but usage of a current is common to all of them. In commercializing an MRAM, how much the writing current thereof can be decreased is very important. According to Non Patent Literature 1, decrease in writing current to 0.5 mA or less, more preferably to 0.2 mA or less is required (Non Patent Literature 1). The reason is that, if the writing current is decreased to about 0.2 mA, a minimum layout is possible in a two transistors-one magnetic tunnel junction (2T-1MTJ) circuit structure proposed in Non Patent Literature 1, and cost performance which is equivalent to or higher than that of an existing volatile memory such as a DRAM or an SRAM can be realized.

Among methods of writing information to an MRAM, the most popular one is a method in which wiring for writing is provided on the periphery of a magnetic storage element and, by a magnetic field generated by a passing current through the wiring, the direction of magnetization of the magnetic storage element is switched. In this method, magnetization reversal occurs due to the magnetic field, and thus, theoretically, writing in one nanosecond or less is possible, which is suitable for realizing a high-speed MRAM. However, a magnetic field for switching magnetization of a magnetic substance whose thermostability and resistance to a disturbance magnetic field are secured is ordinarily about several tens of oersteds (10 Oe=795.77 A/m). In order to generate such a magnetic field, a current of about several milliamperes is necessary. In this case, increase in chip area cannot be avoided, and further, power consumption necessary for writing also increases, and thus, the competitiveness is inferior to those of other random access memories. In addition to this, when the element becomes finer, the writing current thereof further increases, which is not preferred also from the viewpoint of scaling.

In recent years, as means for solving such a problem, the following two methods are proposed. One is spin injection magnetization reversal. This is a method in which, in a laminated film including a first magnetic layer (magnetization free layer) having reversible magnetization and a second magnetic layer (reference layer) which is electrically connected thereto and has fixed magnetization, magnetization of the first magnetic layer (magnetization free layer) is reversed using the interaction between a conduction electron which is spin polarized when a current is passed between the second magnetic layer (reference layer) and the first magnetic layer (magnetization free layer) and a localized electron in the first magnetic layer (magnetization free layer). In reading, the magnetoresistance which develops between the first magnetic layer (magnetization free layer) and the second magnetic layer (reference layer) is used. Therefore, an MRAM which uses the spin injection magnetization reversal method is a two-terminal element. Spin injection magnetization reversal occurs when the current density is equal to or higher than a predetermined level, and thus, when the size of the element becomes smaller, a current which is necessary in writing decreases. In other words, it can be said that the spin injection magnetization reversal method is excellent in scaling. However, generally, a non-magnetic layer is provided between the first magnetic layer (magnetization free layer) and the second magnetic layer (reference layer), and, in writing, a relatively large current has to be passed through the non-magnetic layer, and the resistance to rewriting and the reliability are the problems. Further, the current path for writing and the current path for reading are the same, and thus, there is also concern about miswriting in reading. As described above, spin injection magnetization reversal is excellent in scaling, but there are some barriers to the practical application thereof.

On the other hand, a magnetization reversal method which uses a current-induced domain wall motion phenomenon, which is the second method, can solve the above-mentioned problems of spin injection magnetization reversal. An MRAM which uses the current-induced domain wall motion phenomenon is disclosed in, for example, Patent Literature 1 (Patent Literature 1). In an MRAM which uses the current-induced domain wall motion phenomenon, generally, both end portions of a first magnetic layer (magnetization free layer) having reversible magnetization have magnetization fixed in directions antiparallel to each other. In such a magnetization arrangement, a domain wall is introduced into the first magnetic layer. In this case, as is reported in Non Patent Literature 2, when a current is passed in a direction of piercing the domain wall, the domain wall moves in the direction of conduction electrons, and thus, writing is possible by passing a current through the first magnetic layer (magnetization free layer) (Non Patent Literature 2). In reading information, magnetic tunnel junction (MTJ) that is provided in a region in which the domain wall moves is used to carry out reading using magnetoresistance. Therefore, an MRAM which uses the current-induced domain wall motion method is a three-terminal element, and conforms to the 2T-1MTJ structure proposed in Non Patent Literature 1 described above. Current-induced domain wall motion also occurs when the current density is equal to or higher than a predetermined level, and thus, it can be said that current-induced domain wall motion has, similarly to spin injection magnetization reversal, a scaling property. In addition to this, in an MRAM element which uses current-induced domain wall motion, a writing current does not flow through a non-magnetic layer in the magnetic tunnel junction, and further, the current path for writing and the current path for reading are different from each other. Therefore, the above-mentioned problem of spin injection magnetization reversal is solved.

Further, in Non Patent Literature 2, the current density necessary for current-induced domain wall motion is about $1 \times 10^{18}$ [A/cm$^2$]. In this case, when, for example, the width and the thickness of a layer in which domain wall motion occurs (magnetization free layer) are 100 nm and 10 nm, respectively, the writing current is 1 mA. This cannot satisfy the above-mentioned condition with regard to the writing current. On the other hand, as described in Non Patent Literature 3, it has been reported that, by using a material having perpendicular magnetic anisotropy as a ferromagnetic layer in which current-induced domain wall motion occurs (magnetization free layer), the writing current can be sufficiently reduced (Non Patent Literature 3). From this, it can be said that, when an MRAM is manufactured using current-induced domain wall motion, it is preferred to use a ferromagnetic substance having perpendicular magnetic anisotropy as the layer in which domain wall motion occurs (magnetization free layer).

Structures of an MRAM in which a ferromagnetic substance having perpendicular magnetic anisotropy is used as the magnetization free layer are disclosed in Patent Literature 2 and Patent Literature 3 (Patent Literatures 2 and 3).

CITATION LIST

Patent Literature

Patent Literature 1: JP 2005-191032 A
Patent Literature 2: WO 2009/001706
Patent Literature 3: WO 2009/060749

Non Patent Literature

Non Patent Literature 1: Sakimura et al., "MRAM Cell Technology for Over 500-MHz SoC", IEEE Journal of Solid-State Circuits, 2007, vol. 42, p. 830.

Non Patent Literature 2: Yamaguchi et al., "Real-Space Observation of Current-Driven Domain Wall Motion in Submicron Magnetic Wires", Physical Review Letters, 2004, vol. 92, p 077205.

Non Patent Literature 3: Fukami et al., "Micromagnetic analysis of current driven domain wall motion in nanostrips with perpendicular magnetic anisotropy", Journal of Applied Physics, 2008, vol. 103, p. 07E718.

DISCLOSURE OF THE INVENTION

Problem to be Solved by the Invention

In the MRAM disclosed in Patent Literature 2, a non-magnetic layer for reading and a reference layer are adjacent to a magnetization free layer in which writing is carried out using current-induced domain wall motion. In order to improve the writing characteristics such as reduction in writing current, it is necessary to appropriately design the material and the structure of the magnetization free layer. On the other hand, in order to improve the reading characteristics such as increase in reading signal amount, it is necessary to appropriately design the configuration and the structure of the magnetization free layer, the non-magnetic layer, and the reference layer. Specifically, it can be said that the magnetization free layer is required to be designed so as to satisfy requirements for both the writing characteristics and the reading characteristics. In this case, compared with a case in which design is performed so as to satisfy requirements for any one of the writing characteristics and the reading characteristics, the design flexibility is reduced and it is difficult to improve the characteristics.

On the other hand, in an MRAM disclosed in Patent Literature 3, writing is carried out in the magnetization free layer, a soft response layer having in-plane magnetic anisotropy for sensing the direction of magnetization of the magnetization free layer is provided, and the non-magnetic layer and the reference layer are provided so as to be adjacent thereto. Further, the response layer is provided so as to be displaced from the magnetization free layer in a plane in parallel with a substrate for the purpose of sensing a leakage magnetic field from the magnetization free layer. In the structure disclosed in Patent Literature 3, the writing characteristics can be improved by the design of the magnetization free layer. On the other hand, the reading characteristics can be improved by the design of the MTJ including the response layer, the non-magnetic layer, and the reference layer. Specifically, the writing characteristics and the reading characteristics can be designed independently of each other. On the other hand, the number of processes necessary for forming the structure is larger than the number of processes necessary for forming the structure disclosed in Patent Literature 2. Further, it is also necessary to appropriately adjust the amount of displacement of the response layer with respect to the magnetization free layer in the plane in parallel with the substrate, which results in reduction in process margin and difficulty in causing the element to be finer. Further, the cell area increases, which results in increased cost.

Specifically, it is difficult for the MRAM element disclosed in Patent Literature 2 to accomplish both satisfactory writing characteristics and satisfactory reading characteristics, while the MRAM element disclosed in Patent Literature 3 has disadvantages in view of the process margin and reduction in cost.

An object of this invention is to provide a magnetic memory element which can solve the problem of the MRAM element disclosed in Patent Literature 2 regarding difficulty in independence design of the writing characteristics and the reading characteristics, and which can also solve the problems of the MRAM element disclosed in Patent Literature 3 such as increase in the number of processes, reduction in process margin, and increase in cell area.

More clearly, an object of this invention is to provide a magnetic memory element in which the writing characteristics and the reading characteristics can be designed independently of each other, and increase in the number of processes, reduction in process margin, and increase in cell area are prevented.

Means to Solve the Problem

In order to achieve the above-mentioned object, according to a first embodiment of this invention, there is provided a magnetic memory element, including: a magnetization free layer formed of a ferromagnetic substance having perpendicular magnetic anisotropy; a response layer provided so as to be opposed to the magnetization free layer and formed of a ferromagnetic substance having perpendicular magnetic anisotropy; a non-magnetic layer provided so as to be opposed to the response layer on a side opposite to the magnetization free layer and formed of a non-magnetic substance; and a reference layer provided so as to be opposed to the non-magnetic layer on a side opposite to the response layer and formed of a ferromagnetic substance having perpendicular magnetic anisotropy. The magnetization free layer includes a first magnetization fixed region and a second magnetization fixed region which have magnetization fixed in directions antiparallel to each other, and a magnetization free region in which a magnetization direction is variable.

According to a second embodiment of this invention, there is provided a magnetic memory including the magnetic memory element according to the first embodiment.

Effect of the Invention

According to this invention, it is possible to provide the magnetic memory element in which the writing characteristics and the reading characteristics can be designed independently of each other, and increase in the number of processes, reduction in process margin, and increase in cell area are prevented.

BEST MODE FOR EMBODYING THE INVENTION

Preferred embodiments of this invention are described in detail in the following with reference to the drawings.
(Structure)

Figure 1A:
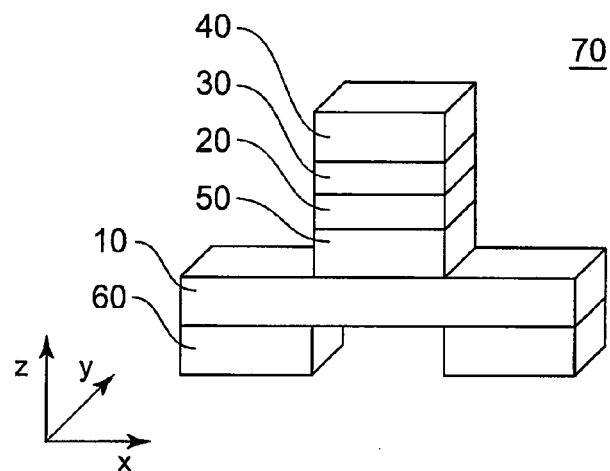
FIG. 1A is a perspective view illustrating a structure of a magnetic memory element 70.
Figure 1B:
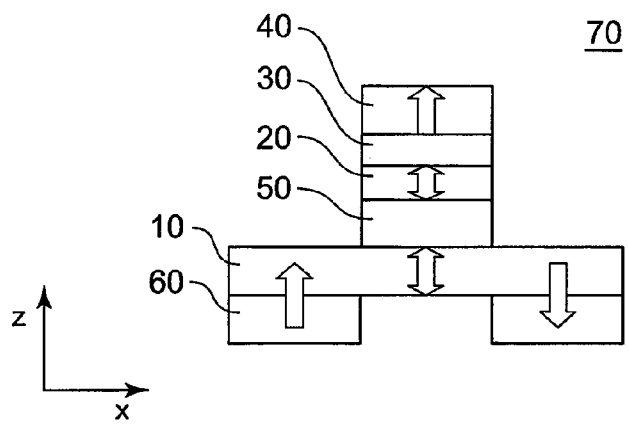
FIG. 1B is a sectional view taken along the line x-z of FIG. 1A, in which arrows designate directions of magnetization.
Figure 1C:
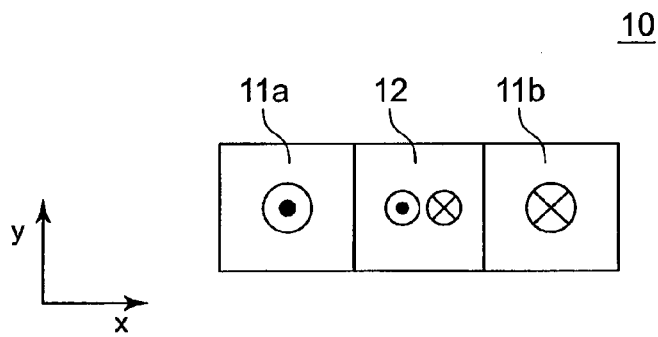
FIG. 1C is an x-y plan view of a magnetization free layer 10 in FIG. 1A.

FIG. 1A to FIG. 1C schematically illustrate a representative structure of principal parts of a magnetic memory element 70 according to this invention. FIG. 1A is a perspective view, FIG. 1B is a sectional view taken along the line x-z, and FIG. 1C is an x-y plan view of a magnetization free layer 10. Note that, in the illustrated x-y-z coordinate system, a z axis denotes a direction perpendicular to a substrate, and x-y axes are in parallel with the plane of the substrate.

The magnetic memory element 70 according to this invention at least includes the magnetization free layer 10, a response layer 20 provided so as to be adjacent to (opposed to) the magnetization free layer 10, a non-magnetic layer 30 provided so as to be adjacent to (opposed to) the response layer 20 on a side opposite to the magnetization free layer 10, and a reference layer 40 provided so as to be adjacent to (opposed to) the non-magnetic layer 30 on a side opposite to the response layer 20. Further, although not indispensable, it is preferred that the magnetic memory element 70 further include a conductive layer 50 provided between the response layer 20 and the magnetization free layer 10 so as to be adjacent to (opposed to) the response layer 20 and a magnetization fixing layer 60 provided so as to be adjacent to (opposed to) the magnetization free layer 10. The magnetization free layer 10, the response layer 20, the reference layer 40, and the magnetization fixing layer 60 are formed of a ferromagnetic substance. In FIG. 1B and FIG. 1C, exemplary directions of magnetization are illustrated by arrows.

FIG. 1C is a plan view schematically illustrating the structure of the magnetization free layer 10. The magnetization free layer 10 is formed of a ferromagnetic substance having perpendicular magnetic anisotropy. Further, the magnetization free layer 10 includes three regions: a first magnetization fixed region 11a; a second magnetization fixed region 11b; and a magnetization free region 12.

The first magnetization fixed region 11a and the second magnetization fixed region 11b have magnetization which is substantially fixed in one direction. Further, the first magnetization fixed region 11a and the second magnetization fixed region 11b have magnetization fixed in directions antiparallel to each other. In FIG. 1C, the first magnetization fixed region 11a and the second magnetization fixed region 11b are illustrated as being fixed in a +z direction and in a −z direction, respectively. Magnetization of the magnetization free region 12 is reversible. In this case, the direction of magnetization of the magnetization free region 12 can be any one of the +z direction and the −z direction.

When the three regions in the magnetization free layer 10 have the above-mentioned magnetization structure, in accordance with the direction of magnetization of the magnetization free region 12, a domain wall is formed at any one of a border between the first magnetization fixed region 11a and the magnetization free region 12 and a border between the second magnetization fixed region 11b and the magnetization free region 12. In the case illustrated in FIG. 1C, when magnetization of the magnetization free region 12 is in the +z direction, a domain wall is formed at the border between the second magnetization fixed region 11b and the magnetization free region 12, and, when magnetization of the magnetization free region 12 is in the −z direction, a domain wall is formed at the border between the first magnetization fixed region 11a and the magnetization free region 12.

Further, in the embodiment illustrated in FIG. 1A to FIG. 1C, the first magnetization fixed region 11a is adjacent to one end portion of the magnetization free region 12, while the second magnetization fixed region 11b is adjacent to the other end portion of the magnetization free region 12. Specifically, in the case illustrated in FIG. 1C, the first magnetization fixed region 11a is adjacent to the end portion of the magnetization free region 12 on a −x direction side, while the second magnetization fixed region 11b is adjacent to the end portion of the magnetization free region 12 on a +x direction side. However, generally, it is enough that the first magnetization fixed region 11a and the second magnetization fixed region 11b are connected to the magnetization free region 12, and the positional relationship thereamong is arbitrary. For example, the first magnetization fixed region 11a may be connected to one end portion of the magnetization free region 12 and the second magnetization fixed region 11b may also be connected to the one end portion of the magnetization free region 12. In this case, the magnetization free layer 10 comprises a three-forked structure.

Further, in the embodiment illustrated in FIG. 1A to FIG. 1C, the response layer 20, the non-magnetic layer 30, and the reference layer 40 are provided so as to be laminated in this order. The response layer 20 and the reference layer 40 are formed of a ferromagnetic substance. Further, the non-magnetic layer 30 is formed of a non-magnetic substance, and is suitably formed of an insulator. In this case, a laminated body of three layers which are the response layer 20, the non-magnetic layer 30, and the reference layer 40 forms a magnetic tunnel junction (MTJ).

The response layer 20 is formed of a ferromagnetic substance having perpendicular magnetic anisotropy. Magnetization of the response layer 20 is reversible, and the direction thereof is any one of the +z direction and the −z direction. Further, the response layer 20 is ferromagnetically coupled to the magnetization free region 12. In accordance with the direction of magnetization of the magnetization free region 12, the direction of magnetization of the response layer 20 is determined The response layer 20 is provided above or below the magnetization free region 12, and is formed so as to overlap the magnetization free region 12 in the x-y plan view.

The reference layer 40 is formed of a ferromagnetic substance having perpendicular magnetic anisotropy, and has magnetization which is substantially fixed in one direction. In the case illustrated in FIG. 1B, magnetization of the reference layer 40 is fixed in the +z direction. Further, although not illustrated, the reference layer 40 may comprise a laminated structure as follows. For example, the reference layer 40 may comprise a structure in which three layers of a ferromagnetic substance, a non-magnetic substance, and a ferromagnetic substance are laminated in this order. In this case, it is preferred that the non-magnetic substance sandwiched between the two ferromagnetic substances have the function of magnetically coupling the ferromagnetic substances thereabove and thereunder in antiparallel directions (providing synthetic ferrimagnetic coupling). As a non-magnetic substance having such a function, Ru is known. With the reference layer 40 comprising the laminated structure having synthetic ferrimagnetic coupling, a leakage magnetic field to the outside can be reduced to reduce magnetic influence on other layers such as the magnetization free layer 10. In addition to this, an antiferromagnetic substance may be adjacent to the reference layer. The reason is that, by causing the antiferromagnetic substance to be adjacent to the reference layer and applying heat treatment in a magnetic field, the direction of magnetization at the interface can be fixed in one direction. Representative antiferromagnetic substances include Pt—Mn and Ir—Mn.

At least one magnetization fixing layer 60 is provided. In the embodiment illustrated in FIG. 1A to FIG. 1C, two magnetization fixing layers 60 are provided, which are provided so as to be adjacent to the first magnetization fixed region 11a and the second magnetization fixed region 11b, respectively. The magnetization fixing layer 60 plays a role in, as described above, directing and fixing magnetization of the first magnetization fixed region 11a and magnetization of the second magnetization fixed region 11b in antiparallel directions. In that sense, it is enough that the magnetization fixing layer 60 is magnetically coupled to the magnetization free layer 10, and is not necessarily required to be provided so as to be adjacent to the magnetization free layer 10. Further, insofar as the first magnetization fixed region 11a and the second magnetization fixed region 11b in the magnetization free layer 10 have magnetization fixed in directions antiparallel to each other, the magnetization fixing layer 60 is not necessarily required to be provided.

The conductive layer 50 is provided between the magnetization free layer 10 and the response layer 20. The conductive layer 50 is formed of a conductive material, and electrically connects the magnetization free layer 10 and the response layer 20.

Further, although not illustrated in FIG. 1A to FIG. 1C, the first magnetization fixed region 11a and the second magnetization fixed region 11b are connected to different external wirings, respectively, and the reference layer 40 is connected to another different external wiring. In other words, the magnetic memory element 70 is a three-terminal element. Note that, another layer may be inserted in the paths between the first magnetization fixed region 11a and the external wiring and between the second magnetization fixed region 11b and the external wiring, and in the path between the reference layer 40 and the external wiring. For example, it is preferred that a conductive contact layer be provided between these layers and the external wirings, respectively. Further, for example, the first magnetization fixed region 11a and the second magnetization fixed region 11b may be connected to external wirings, respectively, through the magnetization fixing layer 60.

(Memory State)

Next, a memory state of the magnetic memory element 70 according to this invention is described.

Figure 2A:
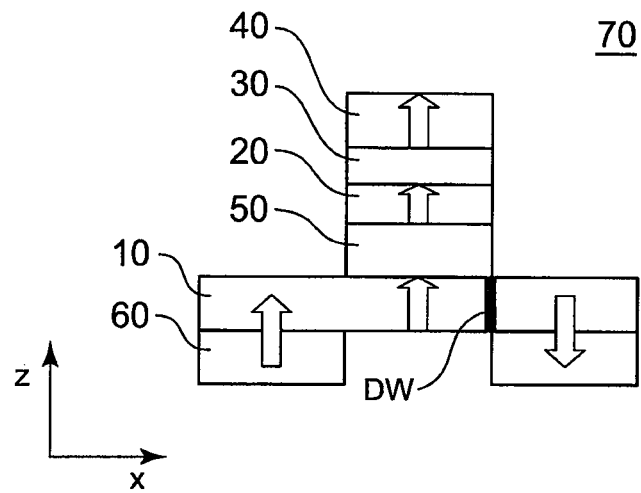
FIG. 2A illustrates the state of magnetization when the magnetic memory element 70 is in a "zero" state.
Figure 2B:
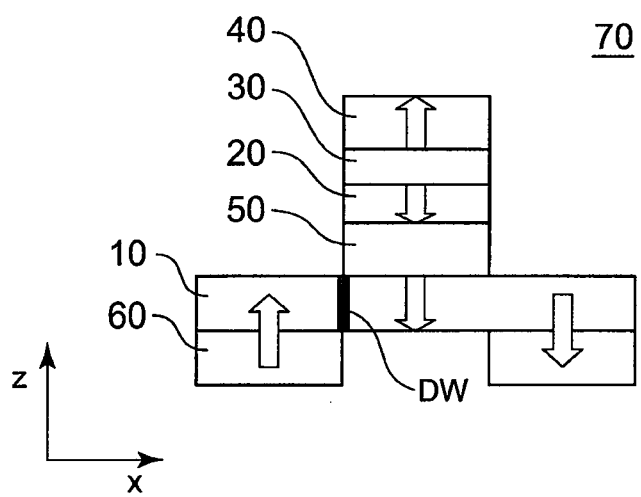
FIG. 2B illustrates the state of magnetization when the magnetic memory element 70 is in a "one" state.

FIG. 2A and FIG. 2B schematically illustrate exemplary states of magnetization when the magnetic memory element 70 according to this invention is in memory states of "zero" and "one", respectively. FIG. 2A illustrates the state of magnetization in the "zero" state while FIG. 2B illustrates the state of magnetization in the "one" state. Note that, in this case, magnetization of the first magnetization fixed region 11a is fixed to the +z direction while magnetization of the second magnetization fixed region 11b is fixed to the −z direction.

Now, in the "zero" state as illustrated in FIG. 2A, magnetization of the magnetization free region 12 and magnetization of the response layer 20 have a component in the +z direction. In this case, a domain wall DW is formed at the border with the second magnetization fixed region 11b. On the other hand, in the "one" state as illustrated in FIG. 2B, magnetization of the magnetization free region 12 and magnetization of the response layer 20 have a component in the −z direction. In this case, the domain wall DW is formed at the border with the first magnetization fixed region 11a.

In FIG. 2A and FIG. 2B, magnetization of the reference layer 40 is illustrated as being fixed in the +z direction. In this case, the MTJ including the response layer 20, the non-magnetic layer 30, and the reference layer 40 in the "zero" state illustrated in FIG. 2A and in the "one" state illustrated in FIG. 2B is of parallel magnetization and of antiparallel magnetization, respectively. Therefore, when a current is passed through the MTJ, a relatively low resistance and a relatively high resistance are realized in the respective cases.

Note that, it is apparent that the relationship between the magnetization state and the memory state ("zero" and "one") defined in FIG. 2A and the FIG. 2B is arbitrarily, and this invention is not limited thereto.

(Operation Method)

1. Initialization Method

Next, a method of initializing the memory state of the magnetic memory element 70 according to this invention is described. Note that, initialization as used herein means a process of directing magnetization of the first magnetization fixed region 11a and magnetization of the second magnetization fixed region 11b so as to be in antiparallel directions and introducing a single domain wall into the magnetization free layer 10.

Figure 3A:
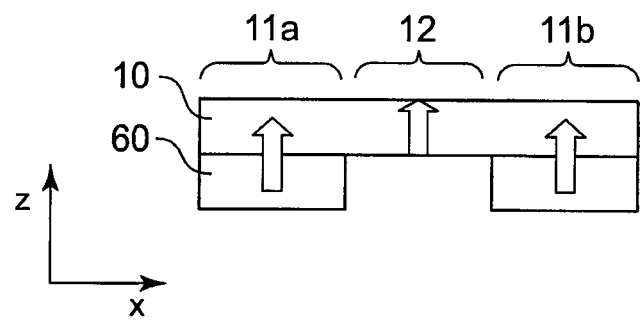
FIG. 3A schematically illustrates an exemplary method of initializing the memory state of the magnetic memory element 70.
Figure 3B:
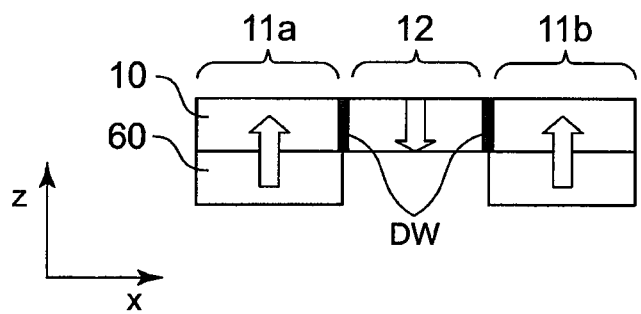
FIG. 3B schematically illustrates the exemplary method of initializing the memory state of the magnetic memory element 70.
Figure 3C:
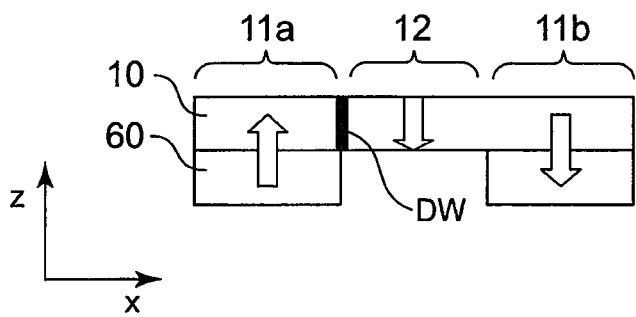
FIG. 3C schematically illustrates the exemplary method of initializing the memory state of the magnetic memory element 70.

FIG. 3A to FIG. 3C schematically illustrate an exemplary method of initializing the memory state of the magnetic memory element 70 according to this invention. Note that, in FIG. 3A to FIG. 3C, layers other than the magnetization free layer 10 and the magnetization fixing layer 60 are omitted for the sake of simplicity. In FIG. 3A to FIG. 3C, the first magnetization fixed region 11a side is harder than the second magnetization fixed region 11b side.

In the exemplary initialization method illustrated in FIG. 3A to FIG. 3C, by applying an external magnetic field in the following steps, the memory state is initialized. First, a sufficiently strong external magnetic field is applied in the +z direction. In this case, as illustrated in FIG. 3A, magnetization in the entire regions is in the +z direction. Then, a relatively weak external magnetic field is applied in the −z direction. In this case, as illustrated in FIG. 3B, magnetization of the magnetization free region 12 is first reversed to be in the −z direction. After that, the external magnetic field in the −z direction is caused to be a little stronger. In this case, as illustrated in FIG. 3C, magnetization on the second magnetization fixed region 11b side is reversed to be in the −z direction. The state illustrated in FIG. 3C is a state in which the domain wall DW is trapped at the border between the first magnetization fixed region 11a and the magnetization free region 12, which corresponds to the "one" state illustrated in FIG. 2B. In this way, by applying an external magnetic field, the memory state of the magnetic memory element 70 can be initialized.

2. Writing Method

Next, a method of writing information to the magnetic memory element 70 according to this invention is described.

Figure 4A:
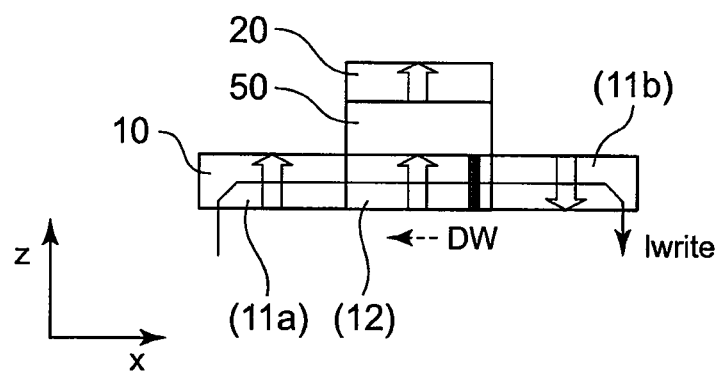
FIG. 4A illustrates a method of writing information to the magnetic memory element 70.
Figure 4B:
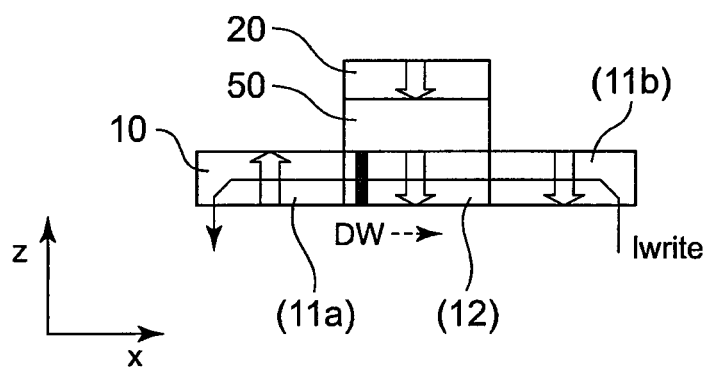
FIG. 4B illustrates a method of writing information to the magnetic memory element 70.

FIG. 4A and FIG. 4B schematically illustrate the method of writing information to the magnetic memory element 70 according to this invention. Note that, in FIG. 4A and FIG. 4B, layers other than the magnetization free layer 10, the conductive layer 50, and the response layer 20 are omitted for the sake of simplicity. In the "zero" state defined in FIG. 2A, a current is introduced in a direction denoted as an arrow Iwrite as illustrated in FIG. 4A. In this case, conduction electrons flow from the second magnetization fixed region 11b through the magnetization free region 12 to the first magnetization fixed region 11a in the magnetization free layer 10. In this case, spin transfer torque (STT) acts on the domain wall DW formed at the border between the second magnetization fixed region 11b and the magnetization free region 12, and the domain wall DW is moved in a negative direction along the x axis. Specifically, current-induced domain wall motion occurs. In this case, magnetization of the first magnetization fixed region 11a is fixed, and thus, the domain wall DW stops at the border between the first magnetization fixed region 11a and the magnetization free region 12. Further, in this case, in accordance with the reversal of magnetization of the magnetization free region 12, magnetization of the response layer 20 is also reversed into the −x direction. This state corresponds to the "one" state defined in FIG. 2B. In this way, "one" can be written.

Further, in the "one" state defined in FIG. 2B, a current is introduced in a direction denoted as an arrow Iwrite as illustrated in FIG. 4B. In this case, conduction electrons flow from the first magnetization fixed region 11a through the magnetization free region 12 to the second magnetization fixed region 11b in the magnetization free layer 10. In this case, spin transfer torque (STT) acts on the domain wall DW formed at the border between the first magnetization fixed region 11a and the magnetization free region 12, and the domain wall DW is moved in a positive direction along the x axis. Specifically, current-induced domain wall motion occurs. In this case, magnetization of the second magnetization fixed region 11b is fixed, and thus, the domain wall DW stops at the border between the second magnetization fixed region 11b and the magnetization free region 12. Further, in this case, in accordance with the reversal of magnetization of the magnetization free region 12, magnetization of the response layer 20 is also reversed into the +x direction. This state corresponds to the "zero" state defined in FIG. 2A. In this way, "zero" can be written.

Note that, when "zero" is written in the "zero" state and when "one" is written in the "one" state, there is no change in state. In other words, overwriting is possible.

3. Reading Method

Next, a method of reading information from the magnetic memory element 70 according to this invention is described.

Figure 5A:
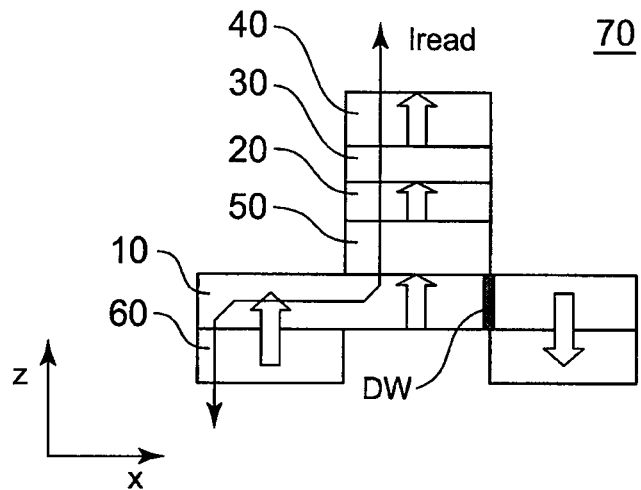
FIG. 5A schematically illustrates a method of reading information from the magnetic memory element 70.
Figure 5B:
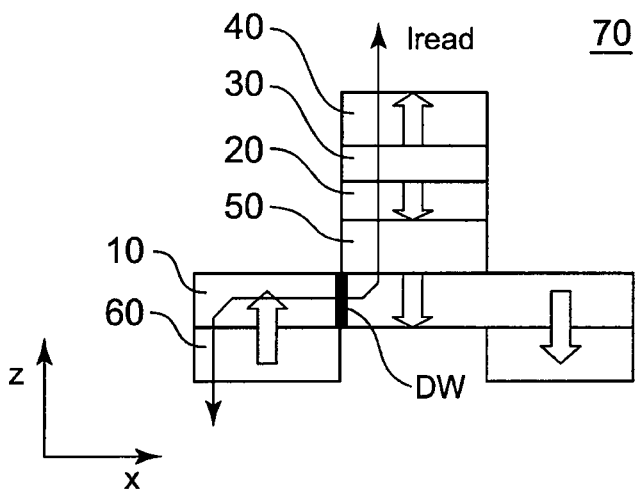
FIG. 5B schematically illustrates a method of reading information from the magnetic memory element 70.

FIG. 5A and FIG. 5B schematically illustrate the method of reading information from the magnetic memory element 70 comprising the structure illustrated in FIG. 1A to FIG. 1C. In this invention, information is read mainly using a tunneling magnetoresistive effect (TMR effect). Therefore, a current head is introduced in a direction of piercing the magnetic tunnel junction (MTJ) including the response layer 20, the non-magnetic layer 30, and the reference layer 40. Note that, the direction of Iread is arbitrary.

When, as illustrated in FIG. 5A, Iread is introduced in the "zero" state defined in FIG. 2A, the MTJ has parallel magnetization, and thus, a relatively low resistance is realized. Further, when, as illustrated in FIG. 5B, head is introduced in the "one" state defined in FIG. 2B, the MTJ has antiparallel magnetization, and thus, a relatively high resistance is realized. In this way, information stored in the magnetic memory element 70 can be detected as a difference in resistance value.

(Circuit Structure)

Next, a circuit structure for introducing a writing current and a reading current into a magnetic memory cell 80 including the magnetic memory element 70 according to this invention is described.

Figure 6:
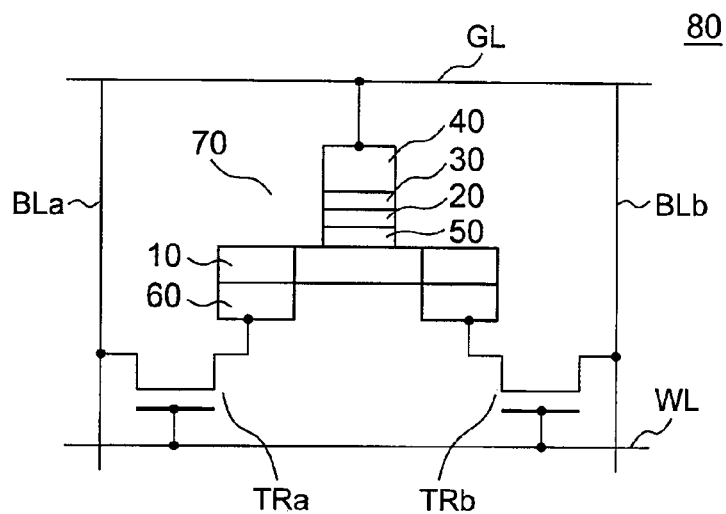
FIG. 6 schematically illustrates the method of reading information from the magnetic memory element 70.

FIG. 6 illustrates an exemplary circuit structure of the magnetic memory cell 80 for one bit. In the example illustrated in FIG. 6, the magnetic memory element 70 is a three-terminal element, and is connected to a word line WL, a ground line GL, and a bit line pair BLa and BLb. For example, a terminal connected to the reference layer 40 is connected to the ground line GL for reading. A terminal connected to the first magnetization fixed region 11a is connected to one of a source and a drain of a transistor TRa, and the other of the source and the drain is connected to the bit line BLa. A terminal connected to the second magnetization fixed region 11b is connected to one of a source a drain of a transistor TRb, and the other of the source and the drain is connected to the bit line BLb. Gates of the transistors TRa and TRb are connected to the common word line WL.

In writing data, the word line WL is set at a HIGH level, and the transistors TRa and TRb are turned on. Further, any one of the bit line pair BLa and BLb is set at the HIGH level while the other is set at a LOW level (ground level). As a result, a writing current flows between the bit line BLa and the bit line BLb through the transistors TRa and TRb and the magnetization free layer 10.

In reading data, the word line WL is set at the HIGH level, and the transistors TRa and TRb are turned on. Further, the bit line BLa is set in an open state, while the bit line BLb is set at the HIGH level. As a result, a reading current flows from from the bit line BLb through the transistor TRb and the MTJ of the magnetic memory element 70 to the ground line GL. This enables reading using magnetoresistance.

Figure 7:
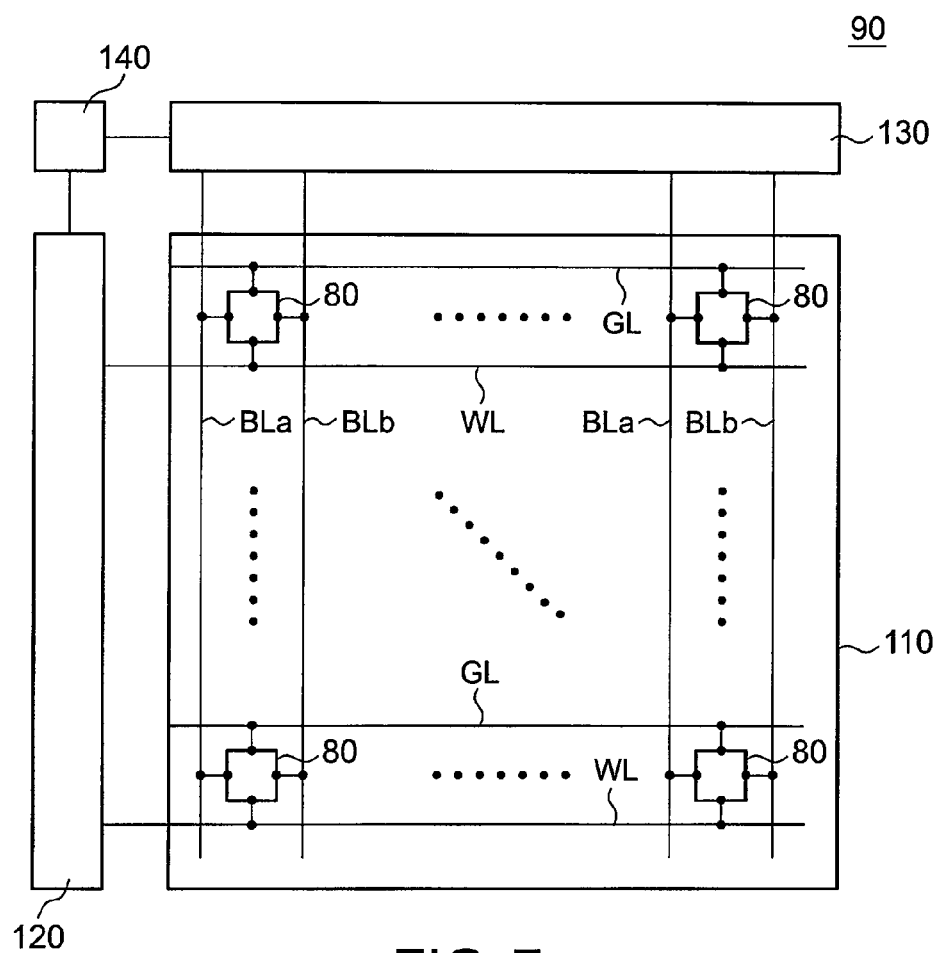
FIG. 7 is a block diagram illustrating an exemplary structure of a magnetic memory 90.

FIG. 7 is a block diagram illustrating an exemplary structure of a magnetic memory 90 according to an embodiment of this invention. The magnetic memory 90 includes a memory cell array 110, an X driver 120, a Y driver 130, and a controller 140. The memory cell array 110 includes a plurality of magnetic memory cells 80 arranged in an array. Each of the magnetic memory cells 80 includes the above-mentioned magnetic memory element 70. As illustrated in FIG. 6 which is referred to above, each of the magnetic memory cells 80 is connected to the word line WL, the ground line GL, and the bit line pair BLa and BLb. The X driver 120 is connected to a plurality of word lines WL, and drives a selected word line among the plurality of word lines WL, which is connected to a magnetic memory cell 80 to be accessed. The Y driver 130 is connected to a plurality of bit line pairs BLa and BLb, and sets the bit lines in a state appropriate for writing data or reading data. The controller 140 controls the X driver 120 and the Y driver 130 in accordance with data writing or data reading.

(Principle)

Next, a principle used in this invention is described.

In the magnetic memory element 70 according to this invention, memory information is stored as the directions of magnetization of the magnetization free region 12 and magnetization of the response layer 20. The memory state is rewritten by current-induced domain wall motion in the magnetization free layer 10. When the memory state is rewritten, the direction of magnetization of the response layer 20 changes, which changes the state of the resistance of the MTJ including the response layer 20, the non-magnetic layer 30, and the reference layer 40. Here, a mechanism in which magnetization of the response layer 20 changes in response to a change in direction of magnetization of the magnetization free region 12 is described.

The magnetization free region 12 is magnetized in any one of the +z direction and the −z direction. Therefore, when the response layer 20 is provided above the magnetization free region (+z direction), at the position of the response layer 20, a leakage magnetic field in the +z direction is formed when the magnetization free region 12 is magnetized in the +z direction, and a leakage magnetic field in the −z direction is formed when the magnetization free region 12 is magnetized in the −z direction. Magnetization reversal of the response layer 20 occurs due to this leakage magnetic field to respond to magnetization of the magnetization free region 12.

Figure 8A:
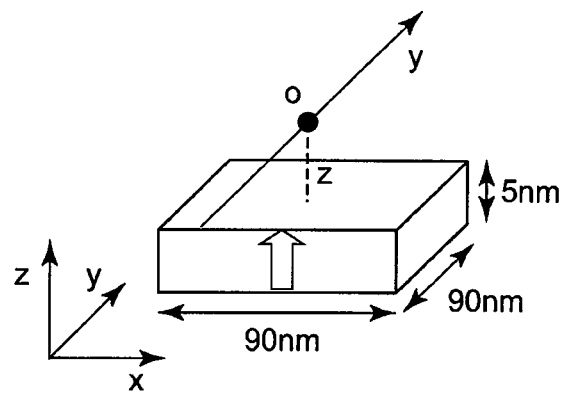
FIG. 8A shows a method of calculation of a leakage magnetic field from a magnetization free region 12.
Figure 8B:
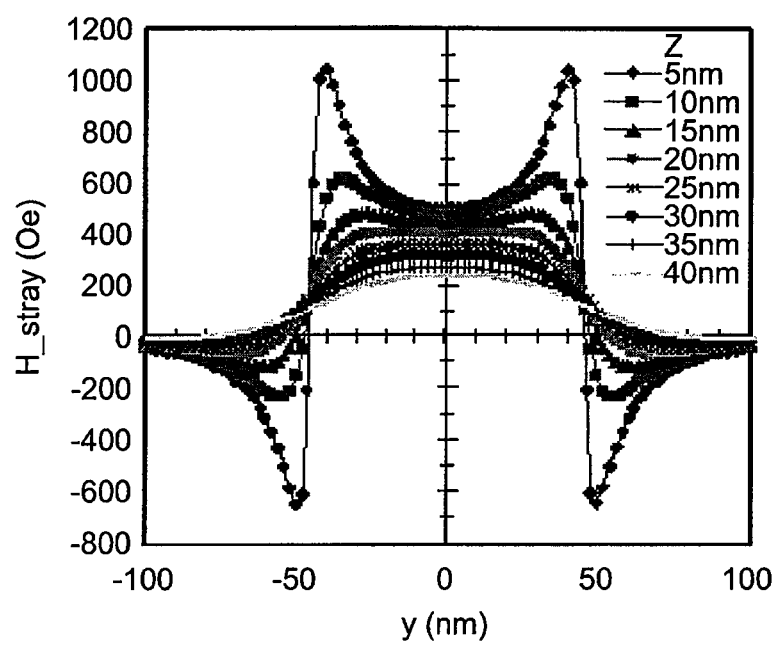
FIG. 8B shows a method of calculation of the leakage magnetic field from the magnetization free region 12.

FIG. 8A and FIG. 8B show the result of calculation of the leakage magnetic field from the magnetization free region 12. In this case, as illustrated in FIG. 8A, the size of the magnetization free region 12 is assumed to be 90 nm×90 nm×5 nm. Dependence of leakage magnetic field which is away from the center of the magnetization free region 12 above the magnetization free region 12 by z nm on y coordinate is shown. As can be seen from FIG. 8B, as the distance (z) from the magnetization free region 12 becomes smaller, the leakage magnetic field becomes stronger. Further, when z=10 nm, a leakage magnetic field of about 500 [Oe] (about $4 \times 10^4$ A/m) is generated. In other words, when z=10 nm, by designing the element so that the coercive force of the response layer 20 is 500 [Oe] ($4 \times 10^4$ A/m) or less, this invention can be carried out. Further, it can be seen that, when z=5 nm, a leakage magnetic field of about 1,000 [Oe] (about $8 \times 10^4$ A/m) is generated therearound. Therefore, when z=5 nm, by designing the element so that the coercive force of the response layer 20 is 1,000 [Oe] ($8\times10^4$ A/m) or less, this invention can be carried out.
(Material)
1. Material of Response Layer and Non-Magnetic Layer From the above-mentioned principle, as the response layer 20, a material having perpendicular magnetic anisotropy so that the coercive force thereof is 1,000 [Oe] ($8\times10^4$ A/m) or less is required to be used. In addition, by increasing the MR ratio of the MTJ including the response layer 20, the non-magnetic layer 30, and the reference layer 40, an intense reading signal can be obtained. By the way, it has been reported recently that perpendicular magnetization of CoFeB adjacent to MgO is developed when the film thickness of CoFeB is in a certain range (see Ikeda et al., "A perpendicular-anisotropy CoFeB—MgO magnetic tunnel junction", Nature Materials, 2010, vol. 9, p 721). In addition, in the above-mentioned literature, it has been reported that an MR ratio of 100% or more is obtained when an MTJ is manufactured using the CoFeB/MgO film.

Figure 9A:
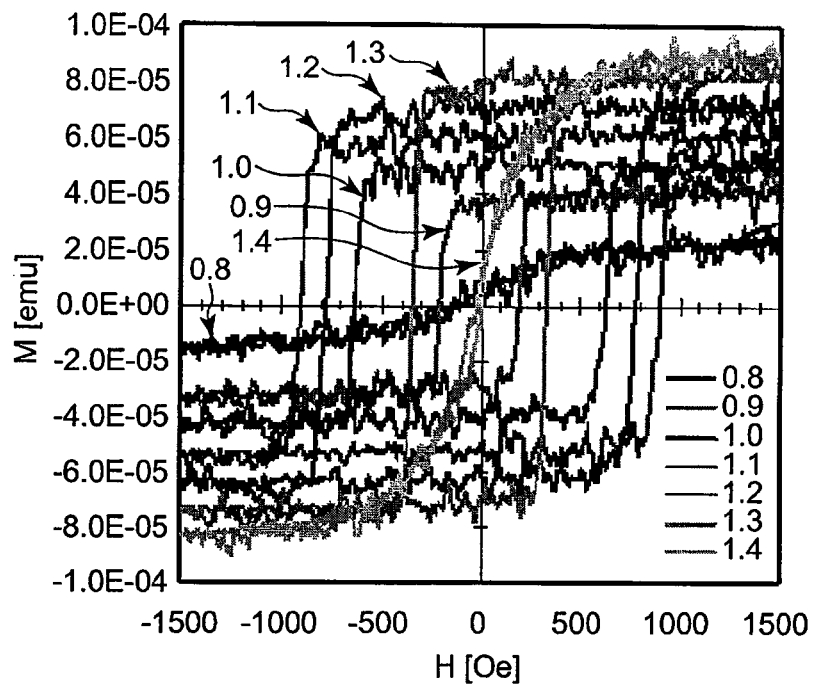
FIG. 9A shows magnetization curves of samples formed by processing a substrate/Ta/CoFeB/MgO/Ta laminated film in a dot-like manner, in which numerics 0.8 to 1.4 in the figure designate the film thicknesses of CoFeB (nm).
Figure 9B:
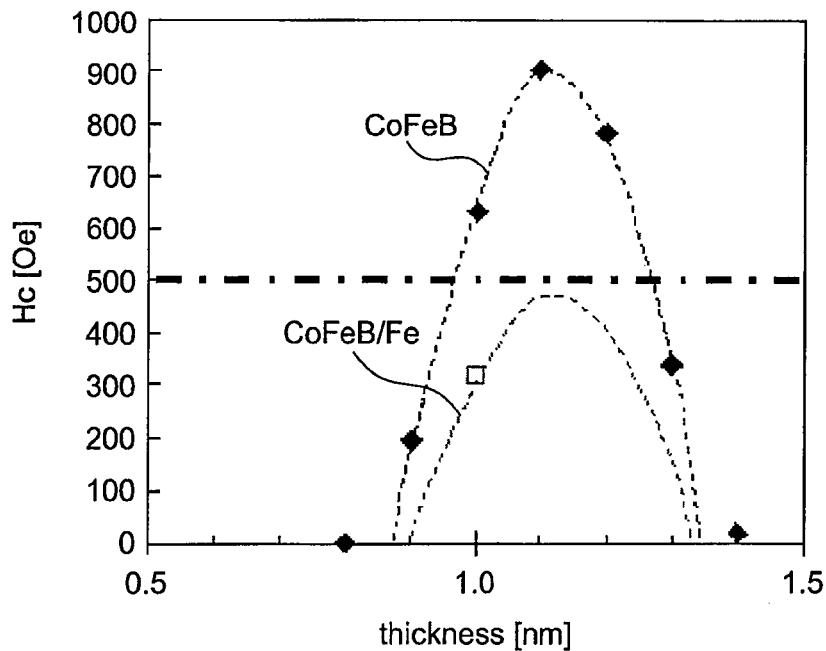
FIG. 9B shows the result of measurement of dependence of a coercive force of the substrate/Ta/CoFeB/MgO/Ta laminated film on a film thickness of CoFeB, in which measurement points when a laminated film of CoFeB and Fe is used instead of CoFeB are also plotted.

FIG. 9A shows magnetization curves of samples formed by processing a laminated film of substrate/Ta/CoFeB/MgO/Ta in a dot-like manner. FIG. 9B shows the result of measurement of dependence of the coercive force of the laminated film on the film thickness of CoFeB. It can be seen that perpendicular magnetic anisotropy is realized in a film thickness range of 0.9 nm to 1.3 nm, and in each case, the coercive force is 1,000 [Oe] ($8\times10^4$ A/m) or less. Further, in FIG. 9B, measurement points when a laminated film of CoFeB and Fe is used instead of CoFeB are also plotted. In the case of using CoFeB/Fe, further weaker coercive force is realized.

Based on the above result, it can be said that, as the materials of the response layer 20 and the non-magnetic layer 30, CoFeB and MgO are particularly preferred.

Further, as can be seen from FIG. 9A and FIG. 9B, when the leakage magnetic field from the magnetization free region 12 is 500 [Oe] ($4\times10^4$ A/m) or more, a wide design margin can be secured for the response layer 20. In this case, as can be seen from FIG. 8, when the center-to-center distance between the magnetization free region 12 and the response layer 20 in a thickness direction is 15 nm or less, the leakage magnetic field is 500 [Oe] ($4\times10^4$ A/m) or more. From this, it can be said that the center-to-center distance between the magnetization free region 12 and the response layer 20 in the thickness direction is preferably 15 nm or less.

2. Material of Other Layers

Preferred materials used for the response layer 20 and the non-magnetic layer 30 are described above. General materials which can be used for the magnetization free layer 10, the response layer 20, the non-magnetic layer 30, the reference layer 40, and the magnetization fixing layer 60 are as follows.

The magnetization free layer 10 is preferred to be formed of a ferromagnetic substance having perpendicular magnetic anisotropy as described above. Specific examples thereof include alloy-based materials such as an Fe—Pt alloy, an Fe—Pd alloy, a Co—Pt alloy, a Co—Pd alloy, a Tb—Fe—Co alloy, a Gd—Fe—Co alloy, a Tb—Fe alloy, a Tb—Co alloy, a Gd—Fe alloy, a Gd—Co alloy, a Co—Cr—Pt alloy, a Co—Re—Pt alloy, a Co—Ru—Pt alloy, and a Co—W alloy, and further, alternately laminated films such as a Co/Pt laminated film, a Co/Pd laminated film, a Co/Ni laminated film, a Co/Cu laminated film, a Co/Ag laminated film, a Co/Au laminated film, an Fe/Pt laminated film, an Fe/Pd laminated film, and an Fe/Au laminated film. Among them, the inventors of this invention have confirmed through experiments that particularly a Co/Ni laminated film can be used to realize a highly controllable current-induced domain wall motion (Applied Physics' Express, vol. 1, p. 101303 (2008)). In this respect, a Co/Ni laminated film is a preferred material of the magnetization free layer 10.

The reference layer 40 is formed of, for example, a ferromagnetic substance having perpendicular magnetic anisotropy. In this case, materials which can be used for the reference layer 40 are the same as those exemplified as materials which can be used for the magnetization free layer 10, and thus, description thereof is omitted here. However, magnetization of the reference layer 40 is required to be stably fixed, and thus, it is preferred that the material thereof be a magnetic substance which is as hard as possible. In this respect, an Fe—Pt alloy, an Fe—Pd alloy, a Co—Pt alloy, a Co/Pt laminated film, a Co/Pd laminated film, and the like are suitable. Further, the direction of magnetization of the reference layer 40 is required to be fixed in one direction, and still further, it is preferred that the leakage magnetic field thereof to the outside be weak. Therefore, as described above, a laminate structure having synthetic ferrimagnetic coupling is preferred. In other words, it is preferred that the reference layer 40 comprise a laminate structure of, for example, a ferromagnetic substance/Ru/a ferromagnetic substance. Further, the reference layer 40 may also be formed of a ferromagnetic substance having in-plane magnetic anisotropy. In this case, any magnetic substance can be used. A representative example is Co—Fe. Note that, an exemplary embodiment when a material having in-plane magnetic anisotropy is used for the reference layer 40 is described later as a fourth modification.

Further, the magnetization fixing layer 60 is formed of a ferromagnetic substance having perpendicular magnetic anisotropy. Materials which can be used in this case are the same as those exemplified as materials which can be used for the magnetization free layer 10, and thus, description thereof is omitted here.

Any conductive material can be used for the conductive layer 50. Note that, when CoFeB is used for the response layer 20 and MgO is used for the non-magnetic layer 30, for the purpose of causing CoFeB to develop perpendicular magnetic anisotropy, it is preferred that the conductive layer 50 contain Ti, V, Cr, Zr, Nb, Mo, Hf, Ta, or W.

Further, in the magnetic memory element 70 according to this invention, as described above, current-induced domain wall motion is used in writing. A current in this case is introduced into the magnetization free layer 10, but, when the conductive layer 50 is adjacent to the magnetization free layer 10, a writing current also flows through the conductive layer 50. When the current is large, the total writing current also increases, which is not preferred. In this respect, it is preferred that the resistance of the conductive layer 50 be relatively high. The resistances of Ti, V, Cr, Zr, Nb, Mo, Hf, Ta, and W described above are relatively higher than that of a Co/Ni-based material described above, and thus, these materials are preferred also in this respect. Further, by nitriding or oxidizing the above-mentioned materials, the resistance of the conductive layer 50 can be further enhanced. Representative examples include Ta—N, Ti—N, and Zr—N.

It is generally preferred that the non-magnetic layer 30 be formed of an insulating material. Specifically, other than Mg—O, Al—O, Al—N, Ti—O, and the like can be used.

A ferromagnetic substance having perpendicular magnetic anisotropy and weak coercive force other than CoFeB described above may also be used for the response layer 20.

In this case, materials which can be used are the same as those exemplified as materials which can be used for the magnetization free layer 10, and thus, description thereof is omitted here.

(Effect)

Next, effects which can be obtained by this invention are described.

Figure 10A:
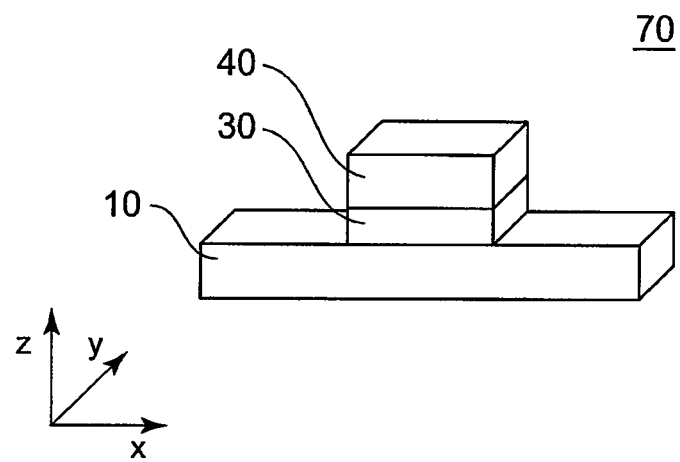
FIG. 10A is a perspective view schematically illustrating a structure of a magnetic memory element disclosed in Patent Literature 2, in which reference numerals correspond to those used in describing this invention.
Figure 10B:
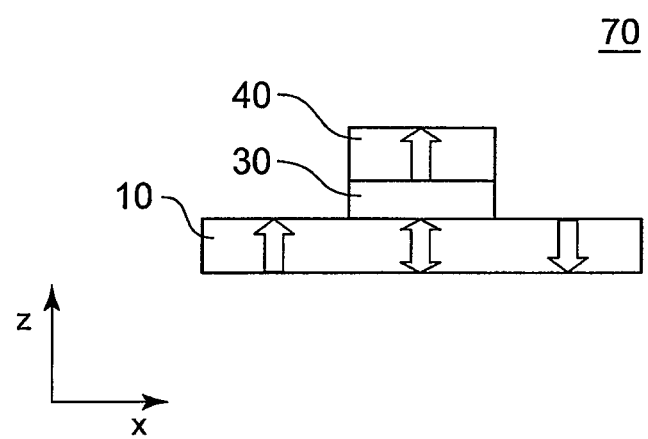
FIG. 10B is a sectional view schematically illustrating the structure of the magnetic memory element disclosed in Patent Literature 2, in which reference numerals correspond to those used in describing this invention.
Figure 11A:
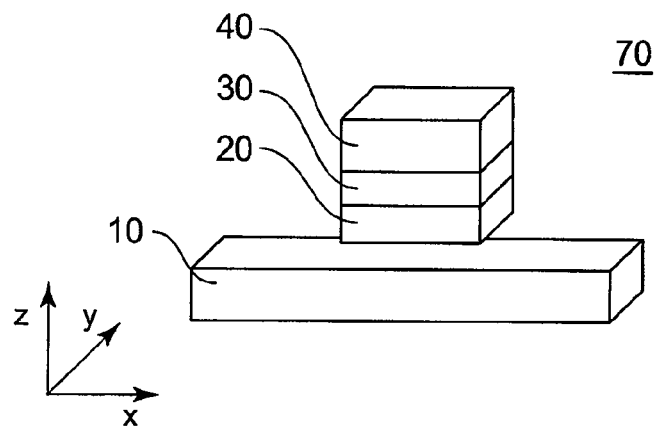
FIG. 11A is a perspective view schematically illustrating a structure of a magnetic memory element disclosed in Patent Literature 3, in which reference numerals correspond to those used in describing this invention.
Figure 11B:
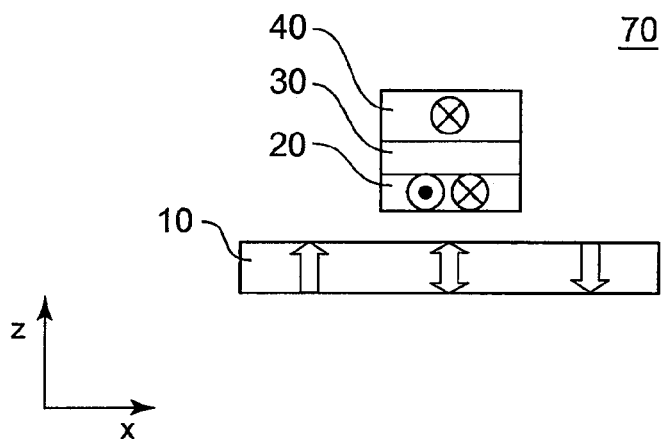
FIG. 11B is a sectional view schematically illustrating the structure of the magnetic memory element disclosed in Patent Literature 3, in which reference numerals correspond to those used in describing this invention.
Figure 11C:
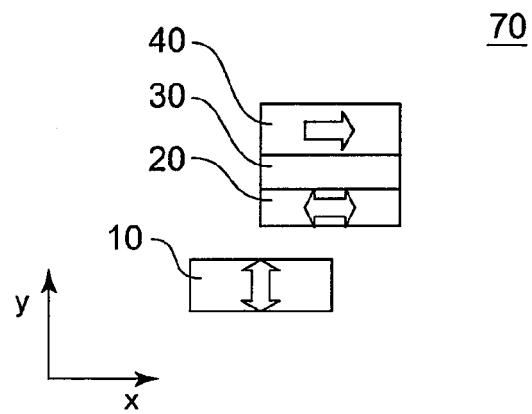
FIG. 11C is a sectional view schematically illustrating the structure of the magnetic memory element disclosed in Patent Literature 3, in which reference numerals correspond to those used in describing this invention.

As described above, a magnetic memory element in which current-induced domain wall motion in a ferromagnetic substance having perpendicular magnetic anisotropy is used for the writing method is disclosed in Patent Literature 2, Patent Literature 3, and the like. FIG. 10A and FIG. 10B schematically illustrate a structure of a magnetic memory element disclosed in Patent Literature 2, and FIG. 11A to FIG. 11C schematically illustrate a structure of a magnetic memory element disclosed in Patent Literature 3. FIG. 10A and FIG. 11A are perspective views, and FIG. 10B, FIG. 11B, and FIG. 11C are sectional views. Note that, reference numerals in the figures correspond to those in the case of this invention. Further, in the following description, names of the respective layers are described so as to correspond to those in the case of this invention.

As illustrated in FIG. 10A and FIG. 10B, in a magnetic memory element 70 described in Patent Literature 2, a non-magnetic layer 30 and a reference layer 40 for reading are adjacent to a magnetization free layer 10 in which writing is carried out using current-induced domain wall motion. In the structure illustrated in FIG. 10A and FIG. 10B, writing is carried out in the magnetization free layer 10. Therefore, in order to adjust the writing characteristics such as reduction in writing current, it is necessary to appropriately design the material and the structure of the magnetization free layer 10. On the other hand, in order to adjust the reading characteristics such as increase in reading signal amount, it is necessary to appropriately design the configuration and the structure of the magnetization free layer 10, the non-magnetic layer 30, and the reference layer 40. Specifically, it can be said that the magnetization free layer 10 is required to be designed so as to satisfy requirements for both the writing characteristics and the reading characteristics. In this case, compared with a case in which design is performed so as to satisfy requirements for any one of the writing characteristics and the reading characteristics, the design flexibility is reduced and it is difficult to improve the characteristics.

On the other hand, as illustrated in FIG. 11A to FIG. 11C, in a magnetic memory element 70 described in Patent Literature 3, writing is carried out in a magnetization free layer 10, a soft response layer 20 having in-plane magnetic anisotropy for sensing the direction of magnetization of the magnetization free layer 10 is provided, and a non-magnetic layer 30 and a reference layer 40 are provided so as to be adjacent thereto. Further, the response layer 20 is provided so as to be displaced from the magnetization free layer 10 in an x-y plane for the purpose of sensing a leakage magnetic field from the magnetization free layer 10. In the structure illustrated in FIG. 11A to FIG. 11C, similarly to that illustrated in FIG. 10A and FIG. 10B, the writing characteristics can be adjusted by the design of the magnetization free layer 10. On the other hand, the reading characteristics can be adjusted by the design of an MTJ including the response layer 20, the non-magnetic layer 30, and the reference layer 40. Specifically, the writing characteristics and the reading characteristics can be designed independently of each other. On the other hand, the number of processes necessary for forming the structure illustrated in FIG. 11A to FIG. 11C is larger than the number of processes necessary for forming the structure illustrated in FIG. 10A and FIG. 10B. Further, it is necessary to appropriately adjust the amount of displacement of the response layer 20 with respect to the magnetization free layer 10 in the x-y plane, which results in reduction in process margin and difficulty in causing the element to be finer. Further, the cell area increases, which results in increased cost.

Specifically, it is difficult for the magnetic memory element that is illustrated in FIG. 10A and FIG. 10B and disclosed in Patent Literature 2 to accomplish both satisfactory writing characteristics and satisfactory reading characteristics, while the magnetic memory element that is illustrated in FIG. 11A to FIG. 11C and disclosed in Patent Literature 3 has disadvantages in view of the process margin and reduction in cost. The magnetic memory element 70 according to this invention solves these problems.

Specifically, in the magnetic memory element 70 according to this invention, the writing characteristics are determined by the magnetization free layer 10 and the reading characteristics are determined by the response layer 20, the non-magnetic layer 30, and the reference layer 40. Therefore, the writing characteristics and the reading characteristics can be designed independently of each other, and the problem of the magnetic memory element according to Patent Literature 2 is solved. Further, the structure of the magnetic memory element 70 according to this invention is similar to that of the magnetic memory element according to Patent Literature 2 that is illustrated in FIG. 10A and FIG. 10B. Therefore, the magnetic memory element 70 according to this invention is free from the disadvantages of the magnetic memory element according to Patent Literature 3.

Specifically, according to this invention, the magnetic memory element which can accomplish both satisfactory writing characteristics and satisfactory reading characteristics and which has a wide process margin can be provided at low cost.

[Modifications]

The magnetic memory element 70 described above can also be carried out using modifications which are described below.

(First Modification)

Figure 12A:
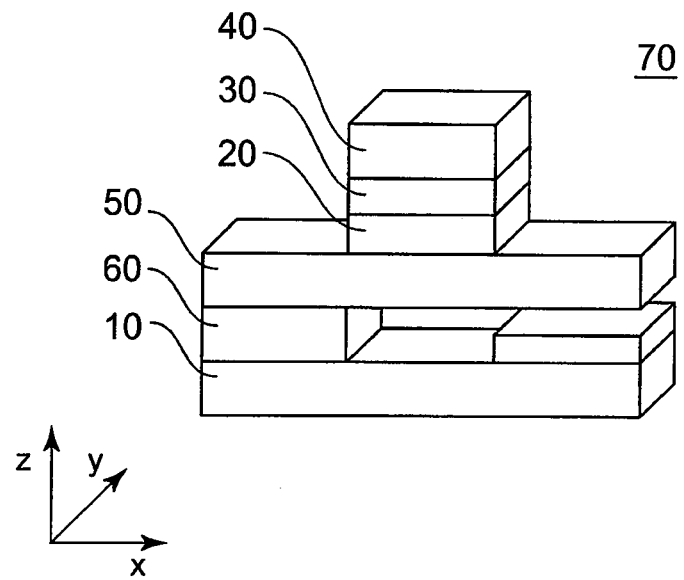
FIG. 12A is a perspective view schematically illustrating a structure of a first modification of the magnetic memory element 70.
Figure 12B:
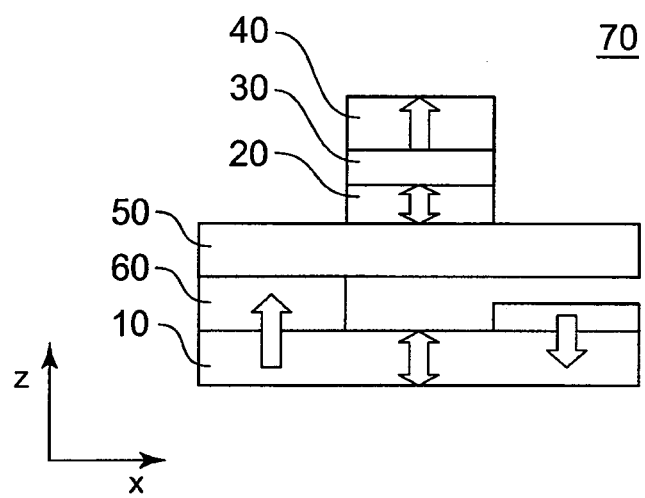
FIG. 12B is a sectional view schematically illustrating the structure of the first modification of the magnetic memory element 70.

FIG. 12A and FIG. 12B schematically illustrate a structure of a magnetic memory element 70 according to a first modification of this invention. The first modification relates to the location of the magnetization fixing layer 60. The magnetic memory element 70 according to this invention includes the magnetization free layer 10, and the first magnetization fixed region 11a and the second magnetization fixed region 11b in the magnetization free layer 10 are fixed in antiparallel directions. Further, FIG. 1A to FIG. 1C illustrate a case in which the magnetization fixing layer 60 is provided for the purpose of fixing magnetization of the first magnetization fixed region 11a and magnetization of the second magnetization fixed region 11b in the antiparallel directions. In FIG. 1A to FIG. 1C, the magnetization fixing layer 60 is provided on the substrate side (−z direction) with respect to the magnetization free layer 10, but the location of the magnetization fixing layer 60 is arbitrary.

FIG. 12A and FIG. 12B illustrate a case in which the magnetization fixing layer 60 is provided above the magnetization free layer 10. As illustrated in FIG. 12A and FIG. 12B, when the magnetization fixing layer 60 is provided above the magnetization free layer 10, the magnetization free layer 10 and the magnetization fixing layer 60 may be deposited in succession, which eases the magnetic coupling therebetween.

The number of processes of the structure illustrated in FIG. 12A and FIG. 12B is larger than that of the structure illustrated in FIG. 1A to FIG. 1C, and is similar to that of the magnetic memory element of Patent Literature 3 illustrated in FIG. 11A to FIG. 11C. However, with regard to the structure illustrated in FIG. 12A and FIG. 12B, compared with the case of the structure illustrated in FIG. 11A to FIG. 11C, the response layer 20 is not required to be displaced in the x-y plane. Therefore, the process margin is wider, and the element area is not increased.

Further, other than the example illustrated in FIG. 12A and FIG. 12B, insofar as magnetization of the first magnetization fixed region 11a and magnetization of the second magnetization fixed region 11b can be directed and fixed in antiparallel directions, the magnetization fixing layer 60 may be provided anywhere and any number of magnetization fixing layers 60 may be provided.

(Second Modification)

FIG. 13A, FIG. 13B, FIG. 14A, and FIG. 14B schematically illustrate a structure of a magnetic memory element 70 according to a second modification of this invention. The second modification relates to the locations and the shapes of the response layer 20, the non-magnetic layer 30, and the reference layer 40. The magnetic memory element 70 according to this invention includes the response layer 20, and the non-magnetic layer 30 and the reference layer 40 which are adjacent thereto, and the locations and the shapes of these layers are arbitrary insofar as certain conditions are satisfied.

Figure 13A:
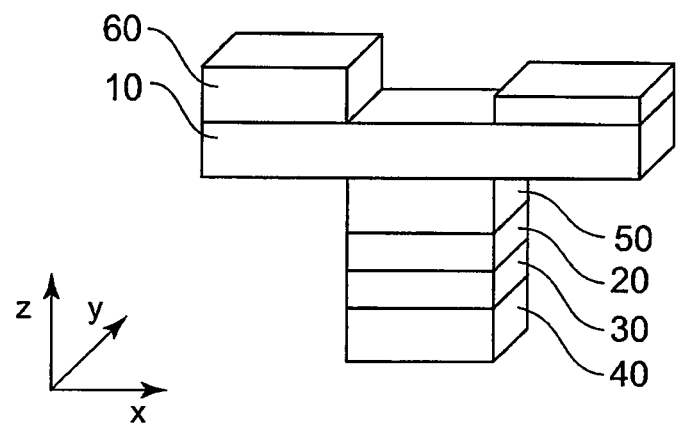
FIG. 13A is a perspective view schematically illustrating a structure of a second modification of the magnetic memory element 70.
Figure 13B:
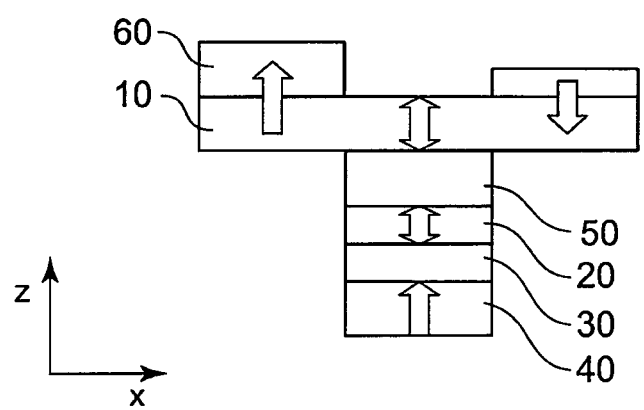
FIG. 13B is a sectional view schematically illustrating the structure of the second modification of the magnetic memory element 70.

FIG. 13A and FIG. 13B illustrate a case in which the response layer 20, the non-magnetic layer 30, and the reference layer 40 are provided on the substrate side (−z direction) with respect to the magnetization free layer 10. The conductive layer 50 is connected to a lower surface of the magnetization free layer 10, and, adjacent thereto, the response layer 20, the non-magnetic layer 30, and the reference layer 40 are provided in this order.

As described above, the direction of magnetization of the response layer 20 is variable with respect to a leakage magnetic field from the magnetization free region 12 in the magnetization free layer 10. In other words, the response layer 20 may be provided at any location insofar as, at the location, the direction of magnetization of the response layer 20 can respond to a leakage magnetic field from the magnetization free region 12, and may be provided on an upper side or on a lower side of the magnetization free layer 10.

Figure 14A:
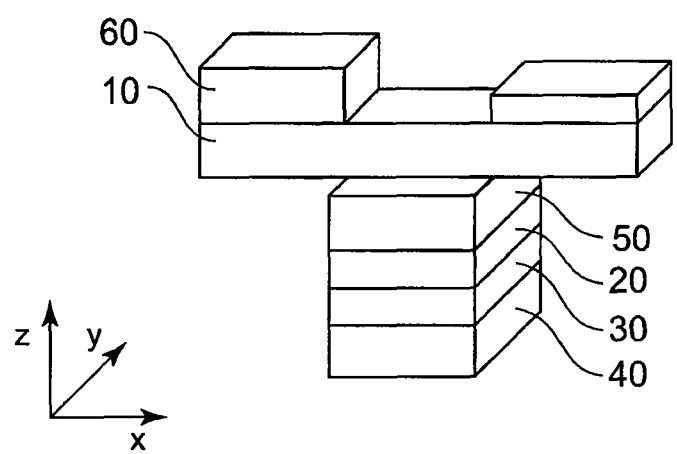
FIG. 14A is a perspective view schematically illustrating the structure of the second modification of the magnetic memory element 70.
Figure 14B:
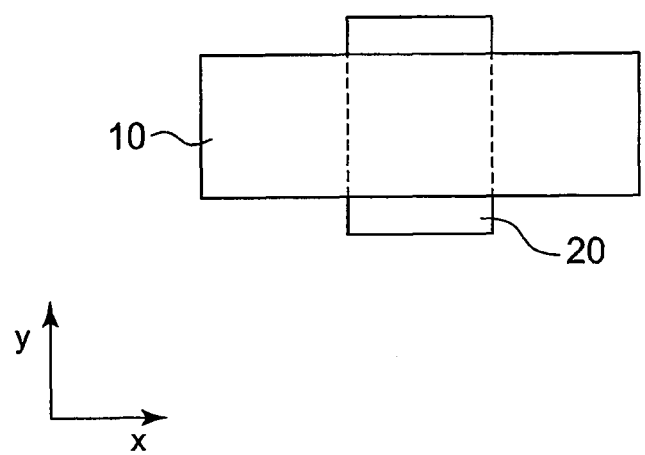
FIG. 14B is a plan view schematically illustrating the structure of the second modification of the magnetic memory element 70.

Further, in FIG. 14A and FIG. 14B, the response layer 20 is formed so as to be larger than a width of the magnetization free layer 10 in the y direction. As can be seen from the graph of FIG. 8 showing the distribution of the leakage magnetic field, the leakage magnetic field from the magnetization free region 12 increases at an edge portion. As illustrated in FIG. 14A and FIG. 14B, when a larger response layer 20 is formed, an intense leakage magnetic field at the edge portion can be detected, which is advantageous from the viewpoint of detection sensibility.

Further, although not illustrated in the figures, the response layer 20 may be formed so as to be displaced from the magnetization free region 12 in the x-y plane. Further, the shape of the response layer 20 may be rectangular or circular.

(Third Modification)

Figure 15A:
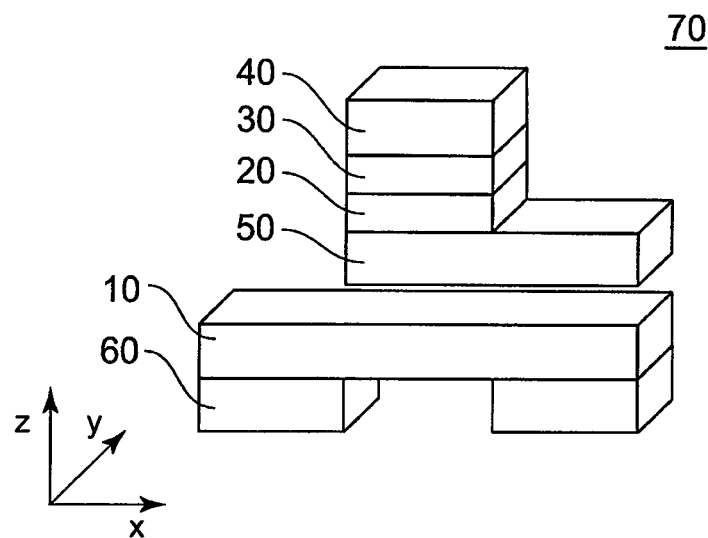
FIG. 15A is a perspective view schematically illustrating a structure of a third modification of the magnetic memory element 70.
Figure 15B:
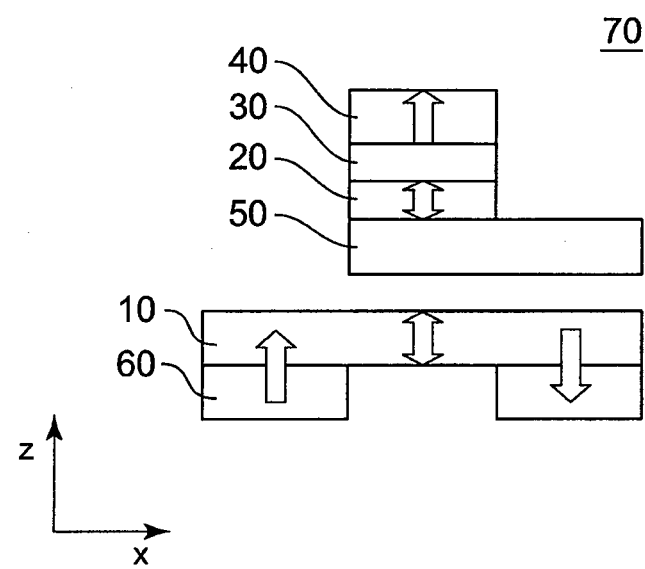
FIG. 15B is a sectional view schematically illustrating the structure of the third modification of the magnetic memory element 70.

FIG. 15A and FIG. 15B schematically illustrate a structure of a magnetic memory element 70 according to a third modification of this invention. The third modification relates to the number of terminals of the magnetic memory element 70. As described with reference to FIG. 1A to FIG. 1C, the magnetic memory element 70 according to this invention is typically a three-terminal element, but the magnetic memory element 70 according to this invention can also be carried out even when the number of the terminals is other than three.

FIG. 15A and FIG. 15B illustrate a structure of a magnetic memory element when this invention is carried out as a four-terminal element. In the example illustrated in FIG. 1A to FIG. 1C, the magnetization free layer 10 is electrically connected via the conductive layer 50 to the response layer 20, the non-magnetic layer 30, and the reference layer 40, but, in the example illustrated in FIG. 15A and FIG. 15B, these layers are electrically isolated.

Figure 16A:
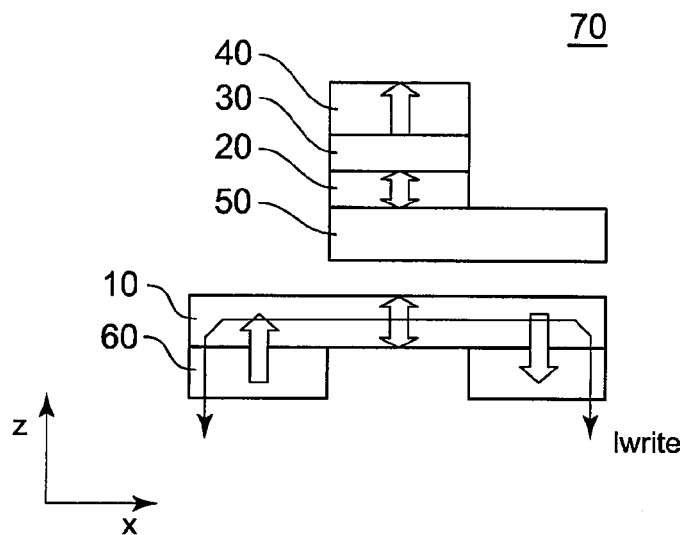
FIG. 16A illustrates a path of a writing current in the magnetic memory element 70 comprising the structure illustrated in FIG. 15A and FIG. 15B.
Figure 16B:
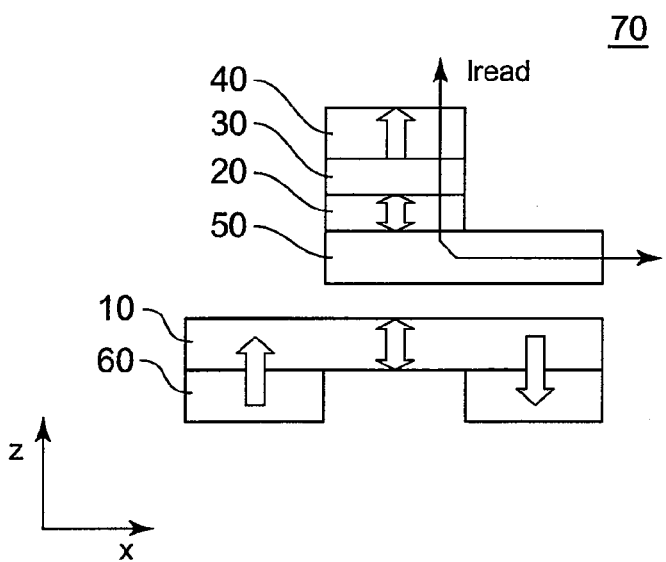
FIG. 16B illustrates a path of a reading current in the magnetic memory element 70 comprising the structure illustrated in FIG. 15A and FIG. 15B.

FIG. 16A and FIG. 16B illustrate a path of a writing current (FIG. 16A) and a path of a reading current (FIG. 16B) in the magnetic memory element 70 comprising the structure illustrated in FIG. 15A and FIG. 15B. In writing, a current is introduced into the magnetization free layer 10. On the other hand, in reading, a current is introduced so as to pierce the response layer 20, the non-magnetic layer 30, and the reference layer 40, and the current path is connected from the conductive layer 50 to an external circuit without passing through the magnetization free layer 10.

INDUSTRIAL APPLICABILITY

Exemplary applications of this invention include a nonvolatile semiconductor memory device to be used in a mobile cellular telephone, a mobile personal computer, or a personal digital assistant (PDA), and a microcomputer incorporating a nonvolatile memory to be used in a motor vehicle or the like. Further, this invention is also applicable to a large scale storage device such as a racetrack memory and the like. In addition, this invention can be used for a nonvolatile logic circuit which can be realized by applying a nonvolatile variable resistance element to a logic circuit.

This application claims priority from Japanese Patent Application No. 2011-113697, filed on May 20, 2011, the entire disclosure of which is incorporated herein by reference.

REFERENCE SIGNS LIST 10 magnetization free layer
11a first magnetization fixed region
11b second magnetization fixed region
12 magnetization free region
20 response layer
30 non-magnetic layer
40 reference layer
50 conductive layer
60 magnetization fixing layer
70 magnetic memory element
80 magnetic memory cell
90 magnetic memory
110 memory cell array
120 X driver
130 Y driver
140 controller

The invention claimed is:
1. A magnetic memory element, comprising:
a magnetization free layer formed of a ferromagnetic substance having magnetic anisotropy in a direction perpendicular to a film surface;
a response layer provided so as to be opposed to the magnetization free layer and formed of a ferromagnetic substance having magnetic anisotropy in the direction perpendicular to the film surface;

a non-magnetic layer provided so as to be opposed to the response layer on a side opposite to the magnetization free layer and formed of a non-magnetic substance; and a reference layer provided so as to be opposed to the non-magnetic layer on a side opposite to the response layer and formed of a ferromagnetic substance having magnetic anisotropy in the direction perpendicular to the film surface, wherein the magnetization free layer comprises a first magnetization fixed region and a second magnetization fixed region which have magnetization fixed in directions antiparallel to each other, a magnetization free region in which a magnetization direction is variable, a domain wall is formed at any one of a border between the first magnetization fixed region and the magnetization free region and a border between the second magnetization fixed region, and the magnetization free region, and a position in plane of a whole of the response layer is located inside of a position in plane of the magnetization free layer, and wherein the response layer, the non-magnetic layer and the reference layer are formed so as to completely overlap the magnetization free region in plane such that the width and depth of the magnetization free region is matched with the width and depth of the response layer in plane, a thickness range of the response layer is 0.9 nm to 1.3 nm, wherein a distance from a center of the magnetization free region to a center of the response layer is 5 nm to 15 nm, and wherein a magnetization of the response layer changes in response to a change in direction of the magnetization of the magnetization free region.

2. The magnetic memory element according to claim 1, further comprising a conductive layer provided between the response layer and the magnetization free layer and formed of a conductive material.

3. The magnetic memory element according to claim 2, wherein the conductive layer comprises at least one element selected from the group consisting of Ti, V, Cr, Zr, Nb, Mo, Hf, Ta, and W.

4. The magnetic memory element according to claim 3, further comprising a magnetization fixing layer provided so as to be magnetically coupled to the first magnetization fixed region and/or the second magnetization fixed region, the magnetization fixing layer being provided for fixing magnetization of the first magnetization fixed region and/or the second magnetization fixed region.

5. The magnetic memory element according to claim 3, wherein the response layer is provided on any one of a front surface and a rear surface of the magnetization free region.

6. The magnetic memory element according to claim 3, wherein the response layer contains CoFeB.

7. The magnetic memory element according to claim 2, further comprising a magnetization fixing layer provided so as to be magnetically coupled to the first magnetization fixed region and/or the second magnetization fixed region, the magnetization fixing layer being provided for fixing magnetization of the first magnetization fixed region and/or the second magnetization fixed region.

8. The magnetic memory element according to claim 2, wherein the response layer is provided on any one of a front surface and a rear surface of the magnetization free region.

9. The magnetic memory element according to claim 2, wherein the response layer contains CoFeB.

10. The magnetic memory element according to claim 1, further comprising a magnetization fixing layer provided so as to be magnetically coupled to the first magnetization fixed region and/or the second magnetization fixed region, the magnetization fixing layer being provided for fixing magnetization of the first magnetization fixed region and/or the second magnetization fixed region.

11. The magnetic memory element according to claim 10, wherein the response layer is provided on any one of a front surface and a rear surface of the magnetization free region.

12. The magnetic memory element according to claim 10, wherein the response layer contains CoFeB.

13. The magnetic memory element according to claim 1, wherein the response layer is provided on any one of a front surface and a rear surface of the magnetization free region.

14. The magnetic memory element according to claim 13, wherein the response layer contains CoFeB.

15. The magnetic memory element according to claim 1, wherein the response layer contains CoFeB.

16. The magnetic memory element according to claim 1, wherein the response layer comprises a laminate structure of CoFeB and Fe.

17. The magnetic memory element according to claim 1, wherein the non-magnetic layer comprises MgO.

18. A magnetic memory, comprising the magnetic memory element according to claim 1.

19. The magnetic memory element according to claim 1, wherein the distance from the center of the magnetization free region to the center of the response layer being 5 nm to 15 nm, results in a leakage magnetic field of about 500 [Oe] to 1,000 [Oe] or less being generated.

20. A magnetic memory element, comprising:

a magnetization free layer formed of a ferromagnetic substance having magnetic anisotropy in a direction perpendicular to a film surface;

a conductive layer provided formed of a conductive material which comprises at least one element selected from the group consisting of Ti, V, Cr, Zr, Nb, Mo, Hf, Ta, and W;

a response layer containing CoFeB provided so as to be opposed to the magnetization free layer and formed of a ferromagnetic substance having magnetic anisotropy in the direction perpendicular to the film surface;

a non-magnetic layer provided so as to be opposed to the response layer on a side opposite to the magnetization free layer and formed of a non-magnetic substance; and a reference layer provided so as to be opposed to the non-magnetic layer on a side opposite to the response layer and formed of a ferromagnetic substance having magnetic anisotropy in the direction perpendicular to the film surface, wherein the magnetization free layer comprises a first magnetization fixed region and a second magnetization fixed region which have magnetization fixed in directions antiparallel to each other, a magnetization free region in which a magnetization direction is variable, a domain wall is formed at any one of a border between the first magnetization fixed region and the magnetization free region and a border between the second magnetization fixed region, and the magnetization free region, and a position in plane of a whole of the response layer is located inside of a position in plane of the magnetization free layer, and wherein the response layer, the non-magnetic layer and the reference layer are formed so as to completely overlap the magnetization free region in plane such that the width and depth of the magnetization free region is matched with the width and depth of the response layer in plane, a thickness range of the response layer is 0.9 nm to 1.3 nm, wherein a distance from a center of the magnetization free region to a center of the response layer is 5 nm to 15 nm, and wherein a magnetization of the response layer changes in response to a change in direction of the magnetization of the magnetization free region.

21. The magnetic memory element according to claim 20, wherein the distance from the center of the magnetization free region to the center of the response layer being 5 nm to 15 nm, results in a leakage magnetic field of about 500 [Oe] to 1,000 [Oe] or less being generated.

\* \* \* \* \*